US010548251B2

(12) United States Patent
Sugimoto

(10) Patent No.: US 10,548,251 B2
(45) Date of Patent: Jan. 28, 2020

(54) COMPONENT SUPPLY DEVICE AND SUPPLY METHOD FOR A COMPONENT MOUNTER

(71) Applicant: FUJI CORPORATION, Chiryu-shi (JP)

(72) Inventor: Koichiro Sugimoto, Anjo (JP)

(73) Assignee: FUJI CORPORATION, Chiryu-shi (JP)

(*) Notice: Subject to any disclaimer, the term of this patent is extended or adjusted under 35 U.S.C. 154(b) by 0 days.

(21) Appl. No.: 15/553,664

(22) PCT Filed: Mar. 2, 2015

(86) PCT No.: PCT/JP2015/056063
§ 371 (c)(1),
(2) Date: Aug. 25, 2017

(87) PCT Pub. No.: WO2016/139714
PCT Pub. Date: Sep. 9, 2016

(65) Prior Publication Data
US 2018/0054931 A1  Feb. 22, 2018

(51) Int. Cl.
H05K 13/08 (2006.01)
H05K 13/04 (2006.01)

(52) U.S. Cl.
CPC ......... *H05K 13/08* (2013.01); *H05K 13/0419* (2018.08); *H05K 13/0857* (2018.08)

(58) Field of Classification Search
None
See application file for complete search history.

(56) References Cited

U.S. PATENT DOCUMENTS 7,220,095 B2    5/2007  Lyndaker et al.
2002/0014002 A1*  2/2002  Bergstrom ........... H05K 13/021
                                                  29/740

(Continued)

FOREIGN PATENT DOCUMENTS

JP    2005-539370 A    12/2005
JP    2011-108909 A    6/2011

OTHER PUBLICATIONS

International Search Report dated May 19, 2015, in PCT/JP2015/056063 filed Mar. 2, 2015.

(Continued)

*Primary Examiner* — Carlos R Ortiz Rodriguez
(74) *Attorney, Agent, or Firm* — Oblon, McClelland, Maier & Neustadt, L.L.P.

(57) ABSTRACT

A component mounter including a control device configured to perform communication control with component supply device, a control device including guidance control section configured to issue guidance of a mounting position of component supply device to which carrier tape should be inserted based on information of the component stored in the carrier tape, a check control section configured to determine whether the carrier tape has been correctly inserted to the mounting position as guided by guidance control section, based on a recognition signal of tape insertion recognition section configured to recognize insertion of the carrier tape into tape insertion opening, and a supply command sending section configured to send a component supply command to the feeder at the mounting position in a case in which it is determined that the carrier tape has been inserted to the mounting position as guided by guidance control section.

20 Claims, 5 Drawing Sheets

(56) References Cited

U.S. PATENT DOCUMENTS

2005/0260391 A1* 11/2005 Nakamura ........ H01L 23/49572
428/209
2009/0229117 A1* 9/2009 Saho .................. H05K 13/0417
29/739
2013/0153619 A1 6/2013 Nagao et al.

OTHER PUBLICATIONS

Extended European Search Report dated Nov. 27, 2017 in Patent Application No. 15883884.7.

* cited by examiner

COMPONENT SUPPLY DEVICE AND SUPPLY METHOD FOR A COMPONENT MOUNTER

TECHNICAL FIELD

The present invention relates to a component supply device and supply method for a component mounter.

BACKGROUND ART

Generally, when loading carrier tape on a feeder mounted on a component supply device of a component mounter, component verification work is performed to create a link between the feeder and components stored in the carrier tape loaded on the feeder. Conventionally, with component verification work, in a state with the feeder removed from a slot of the component supply device, a barcode affixed to the feeder is read, and a barcode of the reel, on which is wound the carrier tape, that is mounted on the feeder is read, and then the feeder is mounted on a specified slot of the component supply device.

However, recently, for example, as disclosed in patent literature 1, feeders have been developed that automatically convey carrier tape inserted into a tape insertion opening to a position at which components are picked up, such that carrier tape can be loaded on a feeder without needing to remove the feeder from the component supply device.

CITATION LIST

Patent Literature

Patent literature 1: JP-A-2005-539370

SUMMARY OF INVENTION

Technical Problem

As above, when using a feeder that can automatically convey carrier tape inserted into a tape insertion opening to a position at which components are picked up, it is possible to load the components only while the feeder remains fixed in a slot of the component supply device. However, in this case, there are problems regarding when and in what manner to perform component verification, and regarding loading the components on the correct feeder without making a mistake.

The present invention takes account of the above problems and an object thereof is to provide a component supply device and supply method for a component mounter for which component verification can be performed and components loaded on the correct feeder without removing the feeder from the component supply device.

Solution to Problem

To solve the above problems, the present invention is a component supply device for a component mounter, wherein the component supply device is configured to automatically convey a carrier tape to a pickup position at which components are picked up when the carrier tape is inserted into a tape insertion opening, the component mounter includes a control device configured to perform communication control between the component mounter and the component supply device, and the control device includes a guidance control section configured to issue guidance of a mounting position (slot) of the component supply device to which the carrier tape should be inserted based on information of the component stored in the carrier tape, the information being sent before the carrier tape is mounted on the component supply device, a check control section configured to determine whether the carrier tape has been correctly inserted to the mounting position as guided by the guidance control section, based on a recognition signal of a tape insertion recognition section configured to recognize insertion of the carrier tape into the tape insertion opening, and a supply command sending section configured to send a component supply command to the feeder at the mounting position in a case in which it is determined that the carrier tape has been inserted to the mounting position as guided by the guidance control section.

Advantageous Effects of Invention

According to the present invention, because carrier tape that stores components can simply be inserted without removing the feeder from the mounting position of the component supply device, it is not necessary to read a barcode of the feeder, for which reading would be difficult, and verification of components can be performed easily. Further, because it is determined whether the carrier tape has been inserted to the feeder at the correct mounting position, mistakes of loading carrier tape to an incorrect feeder can be curtailed.

DESCRIPTION OF EMBODIMENTS

Figure 1:
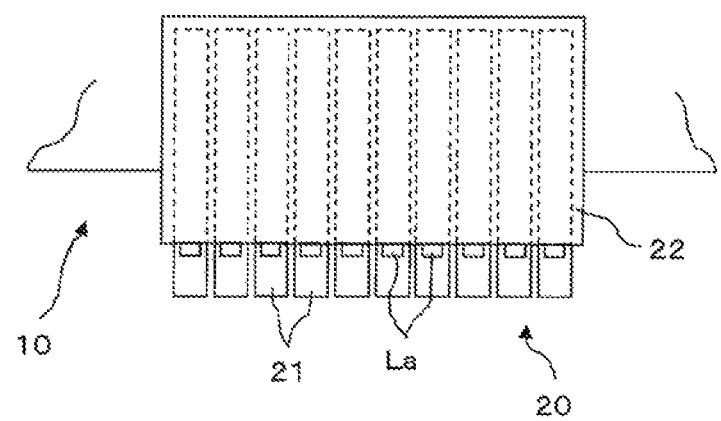
FIG. 1 is a schematic plan view showing a component supply device for a component mounter that is a suitable embodiment of the present invention.

An embodiment of the present invention is described below with reference to the figures. FIG. 1 shows component mounter 10 provided with component supply device 11. Component mounter 10, for example, is provided with board conveyance device 13 (refer to FIG. 6) that conveys a board, not shown, to a component mounting position, and component mounting device 14 (refer to FIG. 6) that includes a suction nozzle, not shown, that picks up a component supplied by component supply device 11, and component mounting device 14 mounts the component picked up by the suction nozzle on the board.

Figure 2:
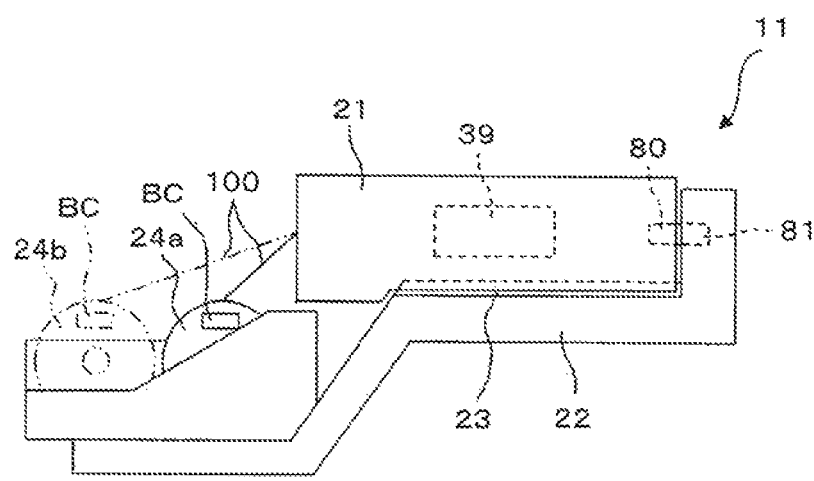
FIG. 2 is a schematic side view showing a feeder that is mounted on the component supply device.

Multiple feeders 21 are removably mounted on component supply device 11 by being mounted on slots 23 (refer to FIG. 2) that include multiple slot positions (not shown in the figures, but designated as S1 to Sn) as mounting positions provided on feeder mounting section 22. When feeder 21 is mounted on slot 23, as shown in FIG. 2, connector 80 provided on feeder 21 is connected to connector 81 attached to feeder mounting section 22, with electric power being supplied to the feeder 21 side from the main body side of component mounter 10 via connectors 80 and 81, and such that the required information can be communicated between feeder 21 and component mounter 10.

As shown in FIG. 1, lamps La indicating a slot position (S1 to Sn) on which feeder 21 should be mounted are provided on feeder mounting section 22 corresponding to each slot 23 on which each feeder 21 is mounted. By this, an operator is able to correctly load carrier tape 100 in which specified components are stored in the feeder 21 of the slot position (mounting position) for which lamp La is illuminated.

Two reels 24a and 24b wound with carrier tape 100 can be removably attached to feeder 21. Barcode BC representing information of the components stored in the carrier tapes 100 wound on reels 24a and 24b is affixed to those reels 24a and 24b.

As described later, feeder 21 is configured to be able to automatically convey carrier tape 100 inserted into a tape insertion opening to a pickup position at which components are picked up, and to automatically discharge carrier tape 100 from the tape insertion opening.

Figure 3:
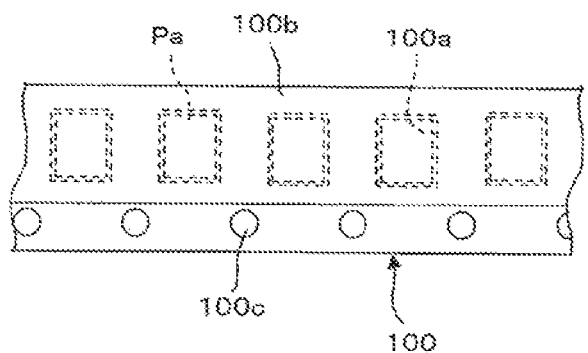
FIG. 3 is a top view of a carrier tape in which components are stored.

As shown in FIG. 3, carrier tape 100 is formed with component storage sections 100a, for storing many components Pa such as electronic components, provided at a fixed interval in the lengthwise direction of the tape. Cover tape 100b that covers the component storage sections 100a is affixed to an upper surface of carrier tape 100. On one side of carrier tape 100, indexing holes 100c are formed at a fixed interval in the lengthwise direction of the tape, with a sprocket, described later, engaging with these indexing holes 100c to advance and reverse carrier tape 100.

Figure 4:
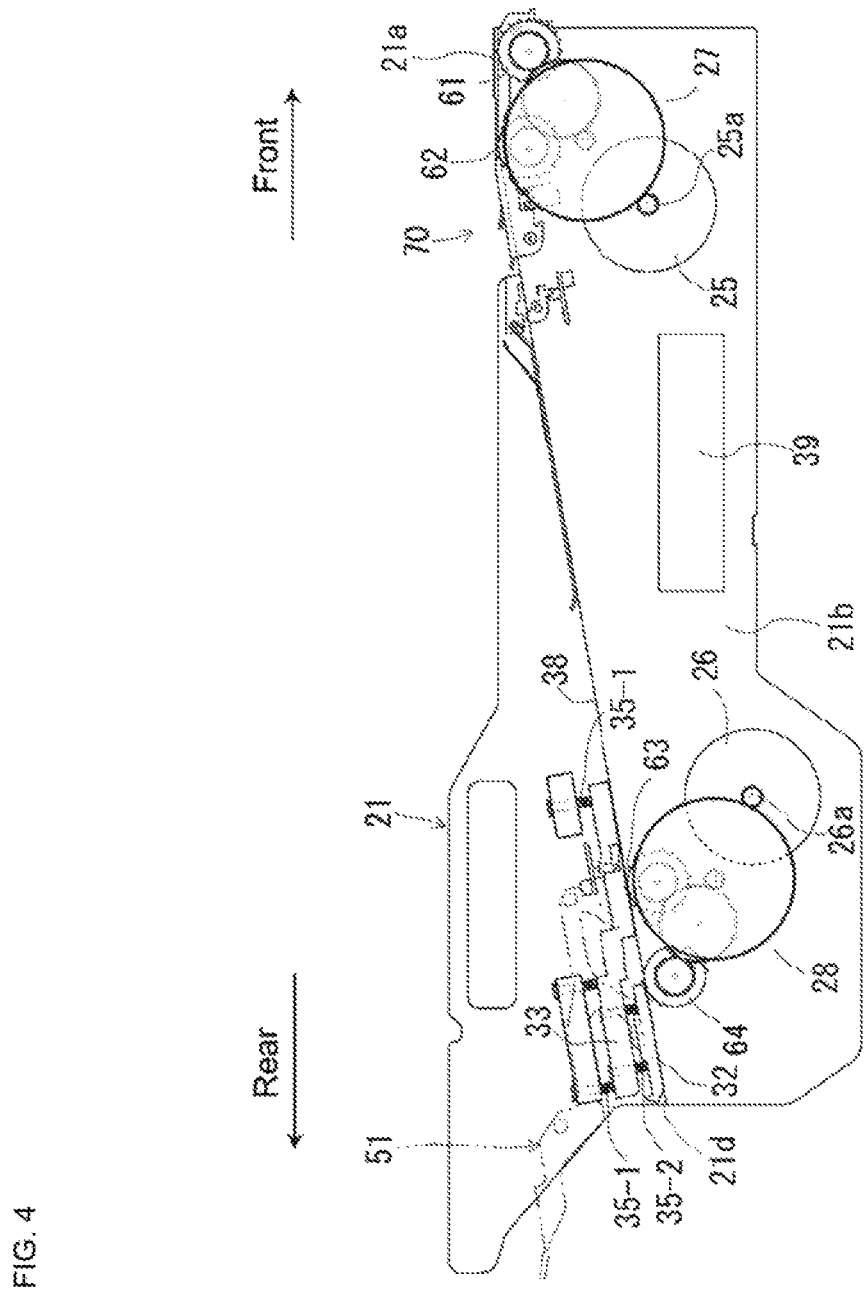
FIG. 4 is a side view of a feeder suitable for an embodiment of the present invention.
Figure 5:
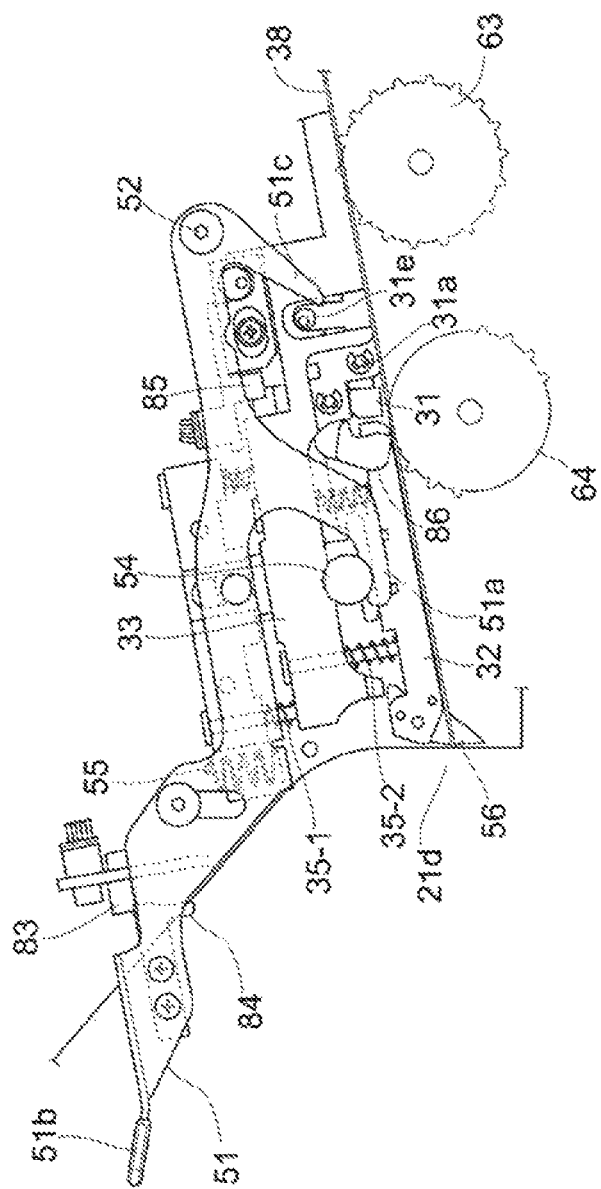
FIG. 5 is an expanded view of a portion of FIG. 4.

Next, the configuration of feeder 21 is described based on FIGS. 4 and 5. Feeder 21 is configured mainly from feeder main body 21b, first servo motor 25, second servo motor 26, tape insertion recognition lever 51, first sprocket 61 and second sprocket 62 as front side sprockets, third sprocket 63 and fourth sprocket 64 as rear side sprockets, tape conveyance rail 38, control section 39, cover tape peeling device 70, and so on. Note that, FIGS. 4 and 5 are diagrams with a side wall of feeder main body 21b removed to show the internal structure of feeder 21.

Tape conveyance rail 38 is for guiding the conveyance of carrier tape 100, and is thus arranged from tape insertion opening 21d provided at the rear section of feeder main body 21b to pickup position 21a at the front section. First sprocket 61 and second sprocket 62 are rotatably provided below the front section of tape conveyance rail 38 to be engagable with indexing holes 100c of carrier tape 100. Third sprocket 63 and fourth sprocket 64 are rotatably provided below the rear section of tape conveyance rail 38 to be engagable with indexing holes 100c of carrier tape 100. Openings (not shown) are provided in tape conveyance rail 38 such that carrier tape 100 being conveyed on tape conveyance rail 38 can engage with each of the sprockets 61 to 64.

First servo motor 25 is a motor that rotates first sprocket 61 and second sprocket 62. Rotation shaft 25a of first servo motor 25 is connected to first sprocket 61 and second sprocket 62 via gear mechanism 27. Second servo motor 26 rotates third sprocket 63 and fourth sprocket 64. Rotation shaft 26a of second servo motor 26 is connected to third sprocket 63 and fourth sprocket 64 via gear mechanism 28. The tape driving mechanism is configured from first and second servo motors 25 and 26.

Entrance retaining member 32 is arranged along the upper surface of the rear section of tape conveyance rail 38 close to tape insertion opening 21d, and is vertically movable so as to be detachable from tape conveyance rail 38. Entrance retaining member 32 is pressed down by spring 35-2, and is usually in contact with an upper surface of tape conveyance rail 38. Downstream-side retaining member 33 pushes on carrier tape 100 at the downstream side to entrance retaining member 32, and is vertically movable so as to be detachable from tape conveyance rail 38. Downstream-side retaining member 33 is pressed down by spring 35-1, and is usually in contact with an upper surface of tape conveyance rail 38.

As shown in FIG. 5, on the rear section of feeder main body 21b, the front section of tape insertion recognition lever 51 is supported on pivot 52 so as to be rotatable around pivot 52. Operation engaging section 51a that engages with the lower surface of engaging member 54 of entrance retaining member 32 is formed in the central section of tape insertion recognition lever 51. Tape insertion recognition lever 51 is rotated in a counterclockwise direction in FIG. 5 by the biasing force of spring 55, and usually operation engaging section 51a is held at a lower position, with entrance retaining member 32 contacting tape conveyance rail 38 due to the biasing force of springs 35-2. Thus, usually, tape insertion opening 21d is blocked by obstructing plate 56 pivoted around the rear section of entrance retaining member 32, such that carrier tape 100 is unable to be inserted into tape insertion opening 21d.

However, when operation knob 51b provided an the rear end of tape insertion recognition lever 51 is raised by an operator, tape insertion recognition lever 51 is rotated against the biasing force of spring 55, such that entrance retaining member 32 is raised against the biasing force of springs 35-2 by operation engaging section 51a. By this, entrance retaining member 32 is raised up and separated from tape conveyance rail 38, such that tape insertion opening 21d is unblocked, and carrier tape 100 is able to be inserted.

Recognition sensor 83 that recognizes that tape insertion recognition lever 51 has been rotated, that is, recognizes that carrier tape 100 can be inserted, is attached to feeder main body 21b. Recognition sensor 83 turns on by dog 84 attached to tape insertion recognition lever 51. The tape insertion recognition section that recognizes the insertion of carrier tape 100 into tape insertion entrance 21d is configured from recognition sensor 83 that responds to operation of tape insertion recognition lever 51 as given above.

Stopper member 31 is provided adjacent to and contacting the downstream side of entrance retaining member 32. Stopper member 31 is capable of rotating due to shaft support section 31a that is provided in a middle portion of stopper member 31 being axially supported by downstream side retaining member 33.

Operation section 51c that is engageable with engaging section 31e provided on a front section of stopper member 31 is formed on a front section of tape insertion recognition lever 51, and when tape insertion recognition lever 51 is rotated against the biasing force of spring 55, engaging section 31e of stopper member 31 engages with operation section 51c. By this, stopper member 31 is rotated in the counterclockwise direction of FIG. 5 around shaft support section 31a against the biasing force of a spring, which is not shown, and the rear end section of stopper member 31 contacts tape conveyance rail 38. Note that, the rear end section of stopper member 31 separates from tape conveyance rail 38 such that usually carrier tape 100 can pass.

Dog 86 that operates tape detection sensor 85 is rotatably supported on downstream-side retaining member 33. When carrier tape 100 is not present on tape conveyance rail 38, the leading end of dog 86 contacts an upper surface of tape conveyance rail 38 due to the biasing force of a spring that is not shown, but when carrier tape 100 is inserted onto tape conveyance rail 38, dog 86 is pushed up by carrier tape 100, thus turning tape detection sensor 85 on.

Described next is operation of feeder 21. Normally, tape insertion recognition lever 51 is held in the position shown in FIGS. 4 and 5 by the biasing force of spring 55, entrance retaining member 32 contacts tape conveyance rail 38, and obstructing plate 56 blocks tape insertion opening 21*d*.

In this state, when operation knob 51*b* of tape insertion recognition lever 51 is raised by an operator, entrance retaining member 32 separates from tape conveyance rail 38 via operation engaging section 51*a*. By this, tape insertion opening 21*d* is opened, and carrier tape 100 can be inserted. When tape insertion recognition lever 51 is raised, recognition sensor 83 responds due to dog 84, such that operation of tape insertion recognition lever 51, that is, insertion of carrier tape 100, can be recognized. The operation signal of recognition sensor 83 is sent to control device 15 via control section 39 of feeder 21, and control device 15 recognizes from the multiple feeders 21 which feeder 21 carrier tape 100 can be inserted into.

In this state, an operator inserts carrier tape 100 onto tape conveyance rail 38 via tape insertion opening 21*d*, and carrier tape 100 is inserted to a specified position where it contacts the rear end of stopper member 31. By this, dog 86 is operated by carrier tape 100, tape detection sensor 85 turns on, and the insertion of carrier tape 100 is detected.

When insertion of carrier tape 100 is detected and tape insertion recognition lever 51 rotates back to its original position, first and second servo motors 25 and 26 are driven, such that third and fourth sprockets 63 and 64 rotate. By this, fourth sprocket 64 engages in indexing holes 100 of carrier tape 100, and carrier tape 100 is conveyed by sprocket 64 to third sprocket 63.

Due to the conveying of carrier tape 100 by fourth sprocket 64, downstream-side retaining member 33 is raised by carrier tape 100 against the biasing force of spring 35-1, and carrier tape 100 is conveyed between downstream-side retaining member 33 and tape conveyance rail 38. When indexing holes 100*c* of carrier tape 100 conveyed by fourth sprocket 64 engage with third sprocket 63, carrier tape 100 is conveyed to second sprocket 62 by third sprocket 63.

When indexing holes 100*c* formed in carrier tape 100 engage with second sprocket 62, carrier tape 100 is indexed to cover tape peeling device 70 by second sprocket 62, and cover tape 100*b* is peeled from the upper surface of carrier tape 100 by cover tape peeling device 70. Then, when indexing holes 100*c* of carrier tape 100 engage with first sprocket 61, components stored in carrier tape 100 are consecutively conveyed to pickup position 21*a* and are picked up from pickup position 21*a* by a suction nozzle, which is not shown, of component mounting device 14.

Note that, when carrier tape 100 is conveyed by feeder 21, by carrier tape 100 raising the front end of stopper member 31, stopper member 31 rotates, and the rear end of stopper member 31 contacts the upper surface of carrier tape 100.

Accordingly, in this state, as described above, when tape insertion recognition lever 51 is rotated (recognition sensor 83 is on) and a succeeding carrier tape 100 is inserted into tape insertion opening 21*d* between the upper surface of leading carrier tape 100 and entrance retaining member 32, the leading end of succeeding carrier tape 100 contacts the rear end of stopper member 31 and stops at that position. Thus, further conveyance of the succeeding carrier tape 100 is prevented, and the succeeding carrier tape 100 stands by at that position.

Figure 6:
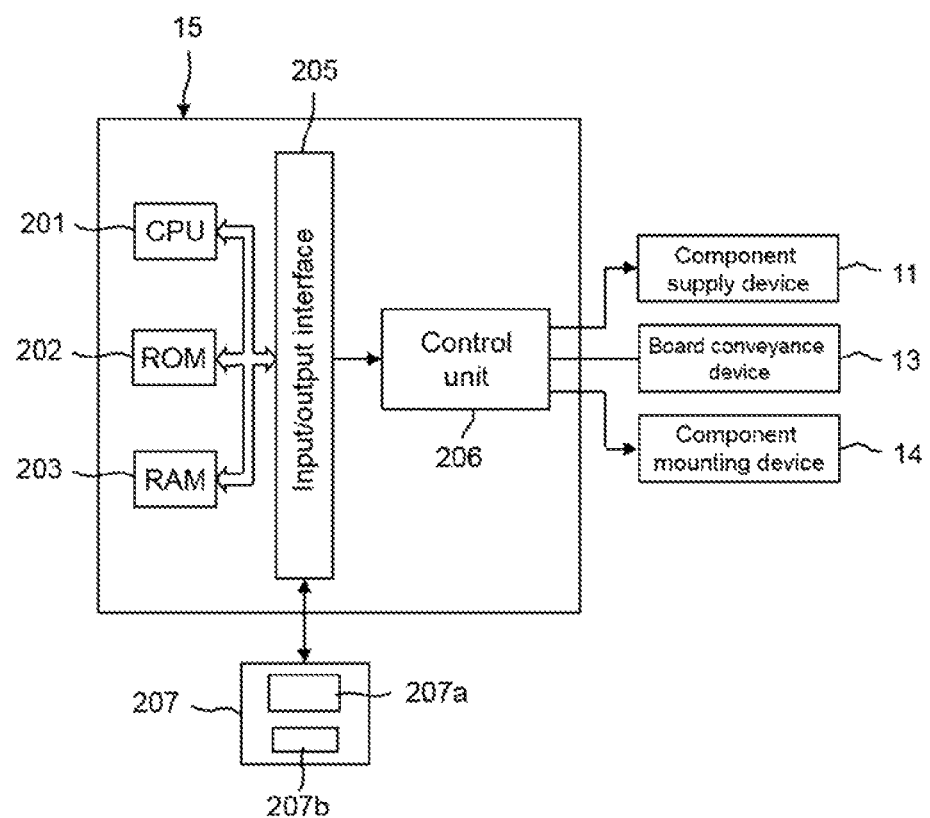
FIG. 6 is a block diagram showing a control device that controls the component mounting device.

Component supply device 11, board conveyance device 13, component mounting device 14, and so on of component mounter 10 are controlled by control device 15 shown in FIG. 6. Control device 15 includes CPU 201 serving as a central processing device, ROM 202 and RAM 203 which serve as a storage device, and input/output interface 205. Connected to input/output interface 205 is control unit 206 that controls each motor of board conveyance device 13 and component mounting device 14, as well as first and second servo motors 25 and 26 provided on each feeder 21 of component supply device 11.

Also, connected to input/output interface 205 is operation panel 207 provided with display device 207*a* such as an LCD, and input device 207*b* for entering data via operation of a keyboard, mouse, or the like. When performing changeover in accordance with a change to the type of board, components (carrier tape 100) that should be loaded on feeders 21 of component supply device 11 are displayed on display device 207*a*.

Stored on ROM 202 are items such as a basic program for mounting components on a board, and a sequence program for controlling sequence operation of component mounting device 14 and the like. Also, memorized on RAM 203 are data related to components to be used during production component arrangement data indicating a feeder 21 with what kind of feeder ID is mounted on which slots position (S1 to Sn) and what kind of component is loaded on that feeder 21, and data related to the production schedule of the board.

Figure 7:
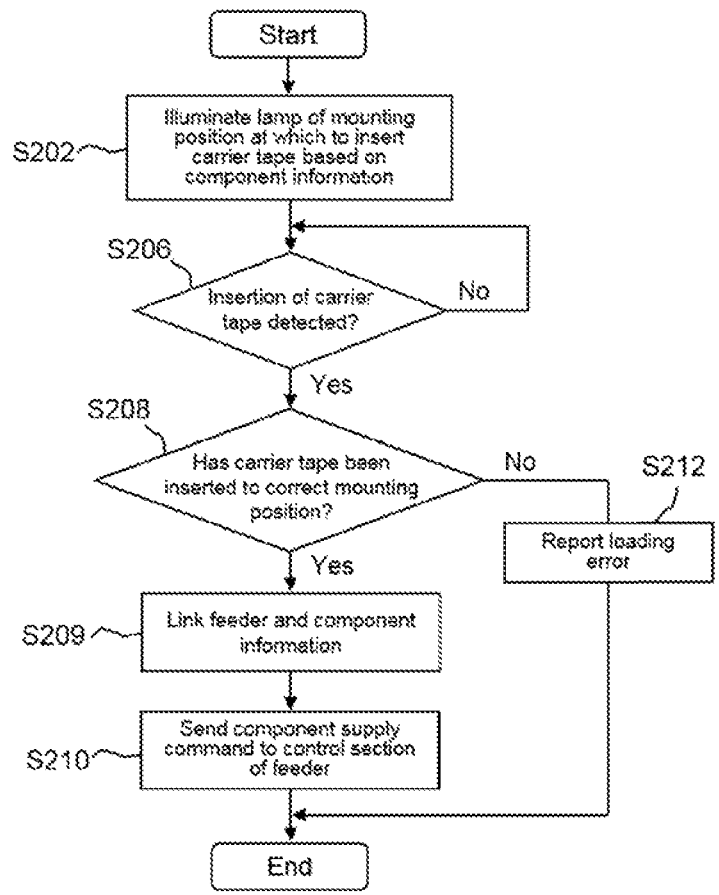
FIG. 7 is a flowchart for conveying the carrier tape to the pickup position at which components are picked up.

FIG. 7 shows a flowchart performed by CPU 201 during changeover for, in a state with feeder 21 mounted on feeder mounting section 22 of component supply device 11, automatically conveying carrier tape 100 inserted into tape insertion opening 21*d* of feeder 21 to pickup position 21*a* at which components Pa stored in carrier tape 100 are picked up by a suction nozzle, which is not shown. Note that, before carrier tape 100 is inserted into tape insertion opening 21*d* of feeder 21, work for recognizing information of the component is performed according to the procedure shown in FIG. 8.

Figure 8:
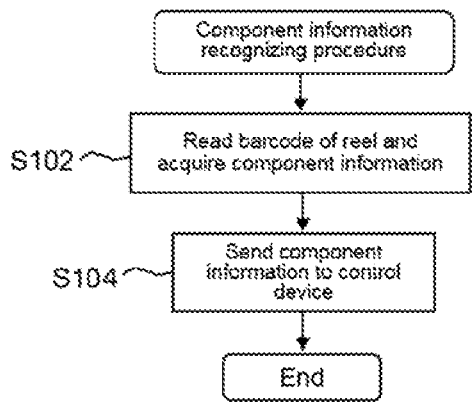
FIG. 8 shows the flow of a component verification procedure.

During work of recognizing information of the component, in step S102 of FIG. 8, barcode BC affixed to reel 24*a* (24*b*) wound around carrier tape 100 trying to be inserted into a feeder 21 is read by a reading device, which is not shown, and information of the components stored in carrier tape 100 is acquired. Next, in step S104, information of the components acquired in step S102 is sent to control device 15 of component mounter 10.

Based on this, control device 15, as shown in FIG. 7, first, in step S202, illuminates lamp La that corresponds to the slot position at which carrier tape 100 should be inserted, based on the sent information of the component. An operator looks at illuminated lamp La and attaches reel 24*a* (24*b*) to feeder 21 mounted on that slot position (hereinafter referred to as third slot position S3), and raises operation knob 51*b* of tape insertion recognition lever 51 of feeder 21 mounted on third slot position (S3) for the feeder 21 for which carrier tape 100 should be inserted to tape entrance opening 21*d*. By this, tape entrance opening 21*d* is opened, and recognition sensor 83 turns on due to dog 84. The on signal of recognition sensor 83 is sent o control device 15 via control section 39.

Continuing, control device 15, in step S206, determines whether carrier tape 100 has been inserted into tape insertion opening 21d based on a signal of tape detection sensor 85 for detecting insertion of carrier tape 100. In step S206, if it is determined that carrier tape 100 has been inserted into tape insertion opening 21d (the determination result is yes), in step S208, control device 15 determines whether carrier tape 100 is correctly loaded at the third slot position (S3) at which lamp La is illuminated.

In a case in which an operator mistakenly loads carrier tape 100 on a feeder 21 at second or fourth slot positions (S2, S4), which are adjacent to the third slot position (S3) for which lamp La is illuminated, the determination result in step S208 is no, and control device 15 reports a loading error during S212.

When the determination result in step S208 is yes, that is, when it is determined that carrier tape 100 was loaded without mistake to the third slot position (S3) for which lamp La was illuminated, processing continues to step S209, and in step S209, the component arrangement data stored in RAM 203 is changed, and a link is created between the feeder 21 of the third slot position (S3) and the information of the component acquired in step S102. Continuing, in step S210, control device 15 sends a component supply command to control section 39 of the feeder 21 mounted at the third slot position (S3).

Based on the component supply command, first and second servo motors 25 and 26 are each rotated in a forward direction by control section 39 of feeder 21 mounted at the third slot position (S3), and carrier tape 100 is advanced by sprockets 61 to 64. By this, components stored in carrier tape 100 are consecutively conveyed to pickup position 21a to be picked up by a suction nozzle, which is not shown.

The guidance control section, which issues guidance of the slot position (mounting position) of component supply device 11 to which carrier tape 100 should be inserted based on the information of the component, is configured from the above step S202. Also, the check control section, which determines whether carrier tape 100 has been correctly inserted to the slot position as guided by the guidance control section (S202) based on the recognition signal of the tape insertion recognition section (recognition sensor 83) that recognizes insertion of carrier tape 100 to tape insertion opening 21d, is configured from the above step S208. Further, the supply command sending section, which sends a component supply command to control section 39 of feeder 21 in a case in which it is determined that carrier tape 100 has been inserted to the feeder 21 of the slot position as guided by the guidance control section (S202), is configured from the above step S210.

According to the above embodiment, component mounter 10 includes control device 15 configured to perform communication control with component supply device 11, and control device 15 includes guidance control section S202 configured to issue guidance of a slot position (mounting position) of component supply device 11 to which carrier tape 100 should be inserted based on information of the component stored in the carrier tape 100, the information of the component being sent before the carrier tape 100 is mounted on component supply device 11, check control section 208 configured to determine whether the carrier tape 100 has been correctly inserted to the slot position as guided by guidance control section S202, based on a recognition signal of tape insertion recognition section (recognition sensor) 83 configured to recognize insertion of the carrier tape 100 into tape insertion opening 21d, and supply command sending section S210 configured to send a component supply command to the feeder 21 at the slot position in a case in which it is determined that the carrier tape 100 has been inserted to the slot position as guided by guidance control section S202.

By this, because carrier tape 100 that stores components can simply be inserted without removing the feeder 21 from slot 23 of component supply device 11, it is not necessary to read a barcode of the feeder 21, for which reading would be difficult, and verification of components can be performed easily. Further, because it is determined whether the carrier tape 100 has been inserted to the feeder 21 at the correct mounting position, mistakes of loading carrier tape 100 to an incorrect feeder 21 can be curtailed.

According to the above embodiment, because the tape insertion recognition section is configured from recognition sensor 83 that outputs a recognition signal based on operation of tape insertion recognition lever 51 provided at tape insertion opening 21d, it is possible to accurately recognize that it is possible to insert carrier tape 100 by an operator operating tape insertion recognition lever 51.

Also, according to the present embodiment, because information of the component is read by an operator from reel 24a on which carrier tape 100 is wound using a reading device, it is possible to acquire information of the component easily without need to read an ID of the feeder 21 or the like.

Also, according to the present embodiment, because guidance control section S202 is lamp La provided at each of the mounting positions, or display device 207a provided on component mounter 10, an operator can easily insert carrier tape 100 at the correct mounting position based on the illumination of lamp La or the display contents of display device 207a.

Further, according to a component supply method of the above embodiment, before mounting carrier tape 100, information of the components stored in carrier tape 100 is sent to component mounter 10, guidance is issued of the slot position (mounting position) to which the carrier tape 100 should be inserted based on the information of the component from component mounter 10, it is determined whether the carrier tape 100 has been correctly inserted to the slot position as guided by the guidance control section, based on a recognition signal of a tape insertion recognition section (recognition sensor 83) configured to recognize insertion of the carrier tape 100 into tape insertion opening 21d, and the carrier tape 100 is driven such that the component is conveyed to pickup position 21a in a case in which it is determined that the carrier tape 100 has been inserted to the guided slot position.

By this, it is not necessary to remove the feeder 21 from slot 23 of component supply device 11, it is not necessary to read a barcode of the feeder 21, for which reading would be difficult, and verification of components can be performed easily. Further, because it is determined whether the carrier tape 100 has been inserted to the feeder 21 at the correct slot position, mistakes of loading carrier tape 100 to an incorrect feeder 21 can be curtailed.

In the above embodiment, descriptions are given of a feeder 21 configured such that two carrier tapes 100 can be inserted, however, the present invention can be applied to a feeder 21 configured such that only one carrier tape 100 can be inserted, in which case, items such as stopper member 31 that makes succeeding carrier tape 100 stand by, and downstream-side retaining member 33 are not required.

Also, in the above embodiment, descriptions are given of a feeder 21 provided with two each of sprockets 61 and 62, and 63 and 64, on front and rear sections respectively, however, the feeder 21 in the above embodiment is merely an example of a suitable embodiment of the present invention. That is, it suffices if feeder 21 is configured to be able to automatically convey carrier tape 100 inserted into tape insertion opening 21d to pickup position 21a at which components are picked up.

Also, in the above embodiment, insertion of components is recognized based on an operation signal of recognition sensor 83 by operation of tape insertion recognition lever 51 that opens tape insertion opening 21d, but the insertion of components may be recognized by a means other than tape insertion recognition lever 51.

In this manner, the invention is not limited to the configuration described in the embodiments described above, and various embodiments may be adopted within a scope that does not depart from the gist of the present invention described in the claims.

INDUSTRIAL APPLICABILITY

The present invention of a component supply device and supply method for a component mounter is applied to an item using a feeder configured to be able to automatically convey carrier tape inserted into a tape insertion opening to a pickup position.

REFERENCE SIGNS LIST

10: component mounter; 11: component supply device; 15: control device; 21: feeder; 21a: pickup position; 21d: tape insertion opening; 22: feeder mounting section; 23: mounting position (slots position); 25, 26: motor; 39: control section; 51: tape insertion recognition lever; 61 to 64: sprocket; 83: tape insertion recognition section (recognition sensor); 100: carrier tape; 100a: component storage section; 207a: display device; La: lamp; S202: guidance control section; S208: recognition control section; S210: supply command sending section

The invention claimed is:
1. A control device, the control device comprising:
circuitry configured to:
issue guidance of a specific mounting position of a plurality of mounting positions of a component supply device to which a carrier tape should be inserted based on information of components stored in the carrier tape, the information of the components stored in the carrier tape being received before the carrier tape is mounted on the component supply device,
determine whether the carrier tape has been correctly inserted to the specific mounting position of the plurality of mounting positions as guided by the guidance based on a recognition signal generated based upon recognition of insertion of the carrier tape into a tape insertion opening, and
send a component supply command to a feeder at the specific mounting position of the plurality of mounting positions in a case in which it is determined that the carrier tape has been correctly inserted to the specific mounting position of the plurality of mounting positions as guided by the guidance.
2. The control device according to claim 1, wherein
the recognition signal is received from a sensor that outputs the recognition signal based on operation of a tape insertion recognition lever provided at the tape insertion opening.

3. The control device according to claim 1, wherein
the information of the components is received from a reading device which reads the information from a reel on which carrier tape is wound.
4. The control device according to claim 1, wherein
the circuitry is configured to issue the guidance by illuminating a lamp provided at the specific mounting position of the plurality of mounting positions or controlling a display device provided on a component mounter to issue the guidance.
5. A component supply method, the component supply method comprising:
issuing guidance of a specific mounting position of a plurality of mounting positions of a component supply device to which a carrier tape should be inserted based on information of components stored in the carrier tape, the information of the components stored in the carrier tape being received before the carrier tape is mounted on the component supply device,
determining whether the carrier tape has been correctly inserted to the specific mounting position of the plurality of mounting positions as guided by the guidance based on a recognition signal generated based upon recognition of insertion of the carrier tape into a tape insertion opening, and
sending a component supply command to a feeder at the specific mounting position of the plurality of mounting positions in a case in which it is determined that the carrier tape has been inserted to the specific mounting position of the plurality of mounting positions as guided by the guidance.
6. The control device according to claim 1, wherein the circuitry is configured to report a loading error in a case which it is determined that the carrier tape has not been correctly inserted to the specific mounting position of the plurality of mounting positions as guided by the guidance.
7. The control device according to claim 1, wherein the circuitry is configured to determine whether the carrier tape has been inserted to the tape insertion opening based on a second recognition signal generated based upon recognition of insertion of the carrier tape into the tape insertion opening.
8. The control device according to claim 7, wherein
the recognition signal is received from a first sensor that outputs the recognition signal based on operation of a tape insertion recognition lever provided at the tape insertion opening, and
the second recognition signal is received from a second sensor that outputs the second recognition signal based on operation of a member moved by the carrier tape at the tape insertion opening.
9. The control device according to claim 1, wherein the circuitry is configured to send the component supply command to the feeder absent receiving identification information of the feeder.
10. The control device according to claim 1, wherein the circuitry is configured to link identification information of the feeder at the specific mounting position of the plurality of mounting positions with the information of the components stored in the carrier tape in the case is which it is determined that the carrier tape has been correctly inserted to the specific mounting position of the plurality of mounting positions as guided by the guidance.
11. A component mounter, the component mounter comprising:
the control device according to claim 1,
the component supply device configured to automatically convey the carrier tape to a pickup position at which components are picked up when the carrier tape is inserted into the tape insertion opening, and the component supply device including the plurality of mounting positions.

12. The component mounter according to claim 11, further comprising:
   a tape insertion recognition lever disposed proximate to the tape insertion opening, and
   a sensor disposed proximate to the tape insertion recognition lever, wherein
   the sensor outputs the recognition signal based on operation of the tape insertion recognition lever, and
   the circuitry receives the recognition signal output from the sensor.

13. The component mounter according to claim 11, further comprising:
   a reading device for reading the information of the components stored in the carrier tape from a reel on which the carrier tape is wound, wherein
   the circuitry is configured to, after reception of the information of the components stored in the carrier tape read from the reel, issue the guidance of the specific mounting position of the plurality of mounting positions.

14. The component mounter according to claim 11, wherein
   the component supply device includes a lamp at each of the plurality of mounting positions, and
   the circuitry is configured to issue the guidance by illuminating a specific lamp corresponding to the specific mounting position of the plurality of mounting positions.

15. The component mounter according to claim 11, further comprising:
   a display device,
   wherein the circuitry is configured to issue the guidance by controlling the display device to issue the guidance.

16. The component mounter according to claim 11, wherein the circuitry is configured to report a loading error in a case which it is determined that the carrier tape has not been correctly inserted to the specific mounting position of the plurality of mounting positions as guided by the guidance.

17. The component mounter according to claim 11, wherein the circuitry is configured to determine whether the carrier tape has been inserted to the tape insertion opening based on a second recognition signal generated based upon recognition of insertion of the carrier tape into the tape insertion opening.

18. The component mounter according to claim 17, further comprising:
   a tape insertion recognition lever disposed proximate to the tape insertion opening,
   a first sensor disposed proximate to the tape insertion recognition lever, and
   a second sensor disposed proximate to the tape insertion opening, wherein
   the first sensor outputs the recognition signal based on operation of the tape insertion recognition lever,
   the second sensor outputs the second recognition signal based on operation of a member moved by the carrier tape at the tape insertion opening, and
   the circuitry receives the recognition signal output from the first sensor and receives the second recognition signal output from the second sensor.

19. The component mounter according to claim 11, wherein the circuitry is configured to send the component supply command to the feeder absent receiving identification information of the feeder.

20. The component mounter according to claim 11, wherein the circuitry is configured to link identification information of the feeder at the specific mounting position of the plurality of mounting positions with the information of the components stored in the carrier tape in the case is which it is determined that the carrier tape has been correctly inserted to the specific mounting position of the plurality of mounting positions as guided by the guidance.

* * * * *